United States Patent
Ohsawa et al.

(10) Patent No.: US 8,982,559 B2
(45) Date of Patent: Mar. 17, 2015

(54) HEAT SINK, COOLING MODULE AND COOLABLE ELECTRONIC BOARD

(75) Inventors: Kenji Ohsawa, Kagoshima (JP); Katsuya Tsuruta, Kagoshima (JP); Toshiaki Kotani, Kagoshima (JP); Kei Mizuta, Kagoshima (JP)

(73) Assignees: Fuchigami Micro Co., Ltd., Kiire (JP); Kagoshima University, Kagoshima (JP)

( * ) Notice: Subject to any disclaimer, the term of this patent is extended or adjusted under 35 U.S.C. 154(b) by 866 days.

(21) Appl. No.: 12/866,883

(22) PCT Filed: Feb. 2, 2009

(86) PCT No.: PCT/JP2009/051694
§ 371 (c)(1),
(2), (4) Date: Jan. 10, 2011

(87) PCT Pub. No.: WO2009/099023
PCT Pub. Date: Aug. 13, 2009

(65) Prior Publication Data
US 2011/0214904 A1    Sep. 8, 2011

(30) Foreign Application Priority Data
Feb. 8, 2008   (JP) .................................. 2008-029151

(51) Int. Cl.
*H05K 7/20*  (2006.01)
*H01L 23/373* (2006.01)
*H01L 23/367* (2006.01)
*H01L 23/34*  (2006.01)
(Continued)

(52) U.S. Cl.
CPC ........ *H01L 23/3736* (2013.01); *H01L 23/3677* (2013.01); *H05K 7/20481* (2013.01); *H05K 7/20518* (2013.01); *H05K 7/20409* (2013.01); *H01L 23/427* (2013.01); *H05K 7/20336* (2013.01)
USPC ........... 361/703; 361/709; 361/719; 361/708; 361/700; 165/80.3; 165/80.4; 165/104.33; 257/722; 257/713

(58) Field of Classification Search
CPC .................. H05K 7/2039–7/20518; H01L 23/36–23/3738
USPC .............. 361/679.46–679.54; 165/80.1–80.5, 165/104.33, 185; 257/712–722; 174/15.1–15.2, 16.1–16.3
See application file for complete search history.

(56) References Cited

U.S. PATENT DOCUMENTS 3,475,657 A * 10/1969 Knowles ....................... 361/787
4,715,438 A   12/1987 Gabuzda et al.
(Continued)

FOREIGN PATENT DOCUMENTS

CN    2791882    6/2006
JP    05-298961  11/1993
(Continued)

OTHER PUBLICATIONS

International Search Report for PCT/JP2009/051694, Apr. 16, 2009.

*Primary Examiner* — Zachary M Pape
(74) *Attorney, Agent, or Firm* — Timothy M. Morella

(57) ABSTRACT

A heatsink is provided with a base body opposed to a heat generating body and absorbing heat from the heat generating body. Thermal resistance of that opposed portion of the base body which is opposed to the heat generating body is higher than thermal resistance of a surrounding portion surrounding the opposed portion.

7 Claims, 11 Drawing Sheets

(51) Int. Cl.
*F28F 7/00* (2006.01)
*H01L 23/427* (2006.01)

(56) References Cited

U.S. PATENT DOCUMENTS

| | | | |
|---|---|---|---|
| 5,947,192 A * | 9/1999 | Kuo | 165/80.3 |
| 6,898,084 B2 * | 5/2005 | Misra | 361/710 |
| 6,899,164 B1 * | 5/2005 | Li et al. | 165/80.3 |
| 7,136,286 B2 * | 11/2006 | Chuang | 361/703 |
| 7,219,721 B2 * | 5/2007 | Miyazaki et al. | 165/185 |
| 7,228,894 B2 * | 6/2007 | Moore et al. | 165/185 |
| 7,654,311 B2 * | 2/2010 | Yang et al. | 165/185 |
| 8,085,531 B2 * | 12/2011 | Lemak et al. | 361/679.54 |
| 2006/0232938 A1 * | 10/2006 | Yeh | 361/704 |
| 2008/0007914 A1 * | 1/2008 | Peng et al. | 361/700 |
| 2012/0162921 A1 * | 6/2012 | Wu et al. | 361/714 |
| 2013/0128461 A1 * | 5/2013 | Nagasawa | 361/704 |

FOREIGN PATENT DOCUMENTS

| | | |
|---|---|---|
| JP | 06-244575 | 9/1994 |
| JP | 07-169886 | 7/1995 |
| JP | 08-195453 | 7/1996 |
| JP | 09-153573 | 6/1997 |
| JP | 2003-086984 | 3/2003 |
| JP | 2005-251892 | 9/2005 |
| JP | 2005-277193 | 10/2005 |
| JP | 2006-237366 | 9/2006 |

* cited by examiner

Heat spreader

FIG. 19
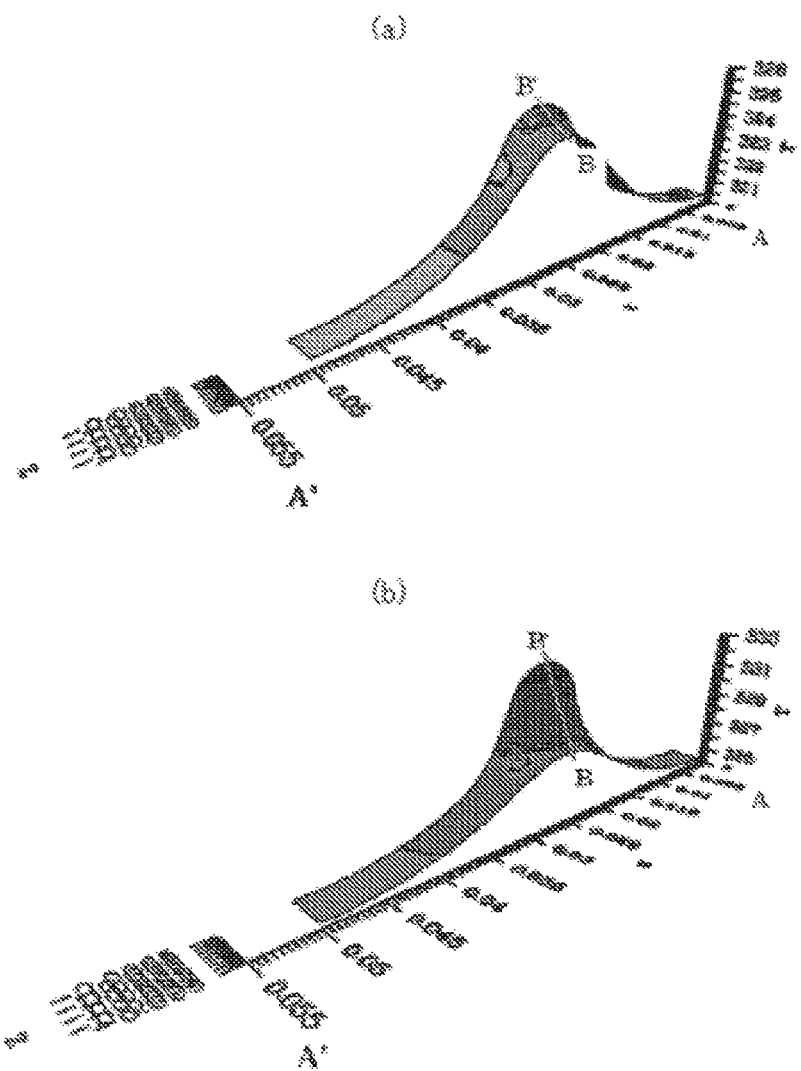
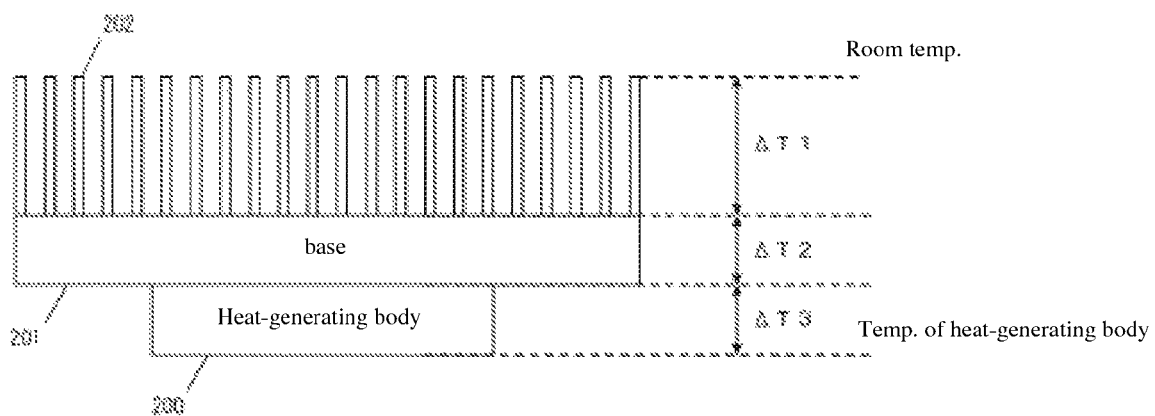
FIG. 20

HEAT SINK, COOLING MODULE AND COOLABLE ELECTRONIC BOARD

REFERENCE TO RELATED APPLICATIONS

The Present Application is a U.S. National Phase Application of PCT Patent Application No. PCT/JP2009/0051694, entitled "Heat Sink, Cooling Module, And Coolable Electronic Board," filed with the Japanese Patent Office (JPO) on 2 Feb. 2009. The PCT Application claims priority to prior-filed Japanese Patent Application No. 2008-029151, entitled "Heat Sink, Cooling Module, And Coolable Electronic Board," filed on 8 Feb. 2008 also with the JPO. The contents of each of the aforementioned Patent Applications are fully incorporated in their entireties herein.

BACKGROUND OF THE PRESENT APPLICATION

The Present Application relates, generally, to a heat sink, a cooling module and a coolable electronic board that cools semiconductor integrated circuits, LED devices, power devices and other heat-generating bodies, and, more particularly, to a heat sink, a cooling module and a coolable electronic board that, by effectively decreasing the temperature gradient in the base without losing durability or reliability, reduces temperature increases in the heat-generating body (or namely, increases the efficiency of cooling of the heat-generating body).

Many semiconductor integrated circuits, LED devices, power devices and various other devices and electronic components that generate large amounts of heat are used in electronic equipment, industrial equipment and automobiles and the like. This is because the current flowing through the interior of these devices and electronic components generates heat in these devices and electronic components. However, a problem exists in that once the heat generated by these devices raises their temperature to above a certain level, their proper operation cannot be guaranteed, and the heat may affect other components, resulting in the possibility of deterioration in the performance of the electronic equipment or industrial equipment. In order to cool such heat-generating bodies, heat sinks having a plurality of fins have conventionally been used, and so heat sinks of various shapes and having various modifications have been proposed.

Generally, it is understood that the heat sink absorbs the heat radiated from the heat-generating body and is radiated into the air from the fins, thus cooling the heat-generating body. Various heat sinks, such as those disclosed in the following documents, have been proposed based on this viewpoint (the contents of each of the following references are incorporated in their entireties herein:

Japanese Patent Application No. 2006-237366 discloses a heat sink wherein the lowest portion crosses a plane perpendicular to a side plate that contains the axis of rotation of an axial fan (see, for example, Claim 4, as well as paragraphs 0014, 0019, 0023, 0025, etc.). Alternatively, the '366 Application also discloses a heat sink wherein the heights of the respective fins become higher the further they are away from the portion that crosses a plane perpendicular to the side plate that contains the axis of rotation of an axial fan (see, for example, paragraphs 0021, 0027, 0032, etc.).

Japanese Patent Application No. 2005-251892 discloses a heat sink that increases the cooling effect on the whole by concentrated cooling of heat-radiating fins provided near the center in contact with the heat-generating body. That is, it discloses a heat sink that utilizes the fact that the heat-generating body is easily mounted in the central area of the rear surface of the base, so when heat is conducted from the base to the heat-radiating fins, this increases the heat distribution ratio of the corresponding heat-radiating fins near the central area.

Japanese Patent Application No. H8-195453 discloses a heat-radiating plate upon which fins are disposed at stipulated intervals in a radial manner from the center of the base. In addition, the '453 Application discloses a heat-radiating plate wherein there are height differences between each fin.

Japanese Patent No. 2,744,566 discloses a heat radiator wherein the base constituting the heat sink is formed in the shape of a concave surface that becomes lower toward the center. Due to the concave surface, heat-radiating fins protruding from the base are taller near the center of the base, and thus a differential in the pressure loss arises compared to the fins on the periphery. Due to this differential in the pressure loss, the cooling air generated from the cooling fan is concentrated in the central area of the heat sink, so the central area where large amounts of heat are generated is effectively cooled.

Japanese Patent Application No. JP 2003-086984 discloses a heat sink with slits provided on the base. In particular, it discloses a heat sink wherein a first slit is provided so as to follow along a heat-receiving surface upon a heat-transfer plate protruding on the side opposite the heat-receiving surface, and a second slit is provided upon the side surface of the heat-transfer plate in a direction perpendicular to the heat-receiving surface. In addition, J the '984 Application also discloses a heat sink whereby the cooling effect is increased by varying the depths of the first slit and the second slit.

Finally, Japanese Patent Application No. 2005-277193 discloses a heat sink wherein a core portion is disposed along the centerline of an axial fan, and thin plate-shaped fins are disposed in radial directions about the core portion.

However, each of these references places emphasis upon increasing the cooling efficiency by efficiently transferring the heat of the heat-generating body from the base of the heat sink to the fins. In particular, the heat-generating body is often in contact with the central area of the rear surface of the heat sink. For this reason, most of the conventional technology is established from the technical viewpoint of cooling the center of this central area, and thus increasing the cooling effect upon the whole.

When addressing the cooling of a heat-generating body, focus generally centers on the decrease of the temperature generated by heating the heat-generating body. However, the problem of heating a heat-generating body is not one of measuring the degree of the decrease in temperature, but rather of measuring whether the problem of the temperature of the heat-generating body exceeding a reference value occurs as a result of the decrease. Thus, rather than focusing on the temperature generated by the heat-generating body, the focus should be on the temperature of the heat-generating body using room temperature as a reference. In other words, rather than focusing on how much the heat-generating body can be cooled, the focus should be on the performance of the heat sink from a cumulative standpoint, or to what degree the temperature increase of the heat-generating body can be suppressed.

Referring to FIG. 20, which illustrates a schematic diagram illustrating the change in temperature of a heat sink and a heat-generating body, the heat sink is provided with a base 201 and fins 202. The heat-generating body 200 is in contact with the central area of the rear surface (heat-receiving surface) of the base 201. The temperature of the heat-generating body 200 is calculated as follows using room temperature as a reference. As shown in FIG. 20, the outside edges of the fins 202 are at the same temperature as room temperature. The heat from the heat-generating body 200 is conducted to the base 201. The heat from the base 201 is conducted to the fins 202. And the heat from the fins 202 is radiated to the outside environment.

Thus, considering the temperature of the heat-generating body 200 on the basis of room temperature, the temperature gradient that arises between the outside environment and the fins 202 (because heat is radiated from the heat-generating body 200, this means that it is possible to measure the temperature of the heat-generating body 200 even by considering the temperature difference between the outside environment and the bases of the fins 202) is defined to be $\Delta T1$. Similarly, the temperature gradient from the bases of the fins 202 to the heat-receiving surface of the base 201 is $\Delta T2$. Moreover, the temperature gradient from the heat-receiving surface of the base 201 to the heat-generating body 200 is $\Delta T3$. Accordingly, the temperature of the heat-radiating body when room temperature is used as the reference is given by $\Delta T1+\Delta T2+\Delta T3$. If this temperature of the heat-radiating body, as determined by the sum of $\Delta T1-\Delta T3$, exceeds a stipulated value, then this causes malfunctions in the heat-generating body.

The references cited above are thought to have emphasized either Policy One—increase the rate of conduction by which heat from the heat-generating body is conducted to the fins, or Policy Two—increase the efficiency of cooling in the vicinity of the central area of the base with which the heat-generating body is in contact.

However, if Policy One is emphasized, conduction occurs readily solely in the direction of thickness of the base, so a problem occurs wherein the effect of reducing the heat flux in the direction of thickness of the base is weakened. If this effect of reducing the heat flux in the direction of thickness of the base is weakened, there is a problem in that the effect of reducing the temperature gradient in the base is also weakened. This is because the temperature gradient in the base is determined by the product of the thermal resistance of the base and the thermal flux which indicates the ease of conduction of heat. With the references, in order to lower this thermal resistance, Reference 2 focused on the shape of the base, while References 1 and 3 focused on the height of the fins. As a result, while the thermal resistance in the direction of the thickness of the base becomes smaller, the thermal flux becomes larger as the thermal resistance becomes smaller, and as a result the temperature gradient becomes larger.

On the other hand, Policy Two is expressed as a technique for concentrating cooling in the vicinity of the central area, as in Reference 4. In this case, there is a focus upon heat transport only in the direction of the thickness of the base, so the thermal resistance in the thickness direction becomes small. However, the thermal flux becomes large and as a result the temperature gradient becomes larger. As is clear from FIG. 20, in order to suppress increases in the temperature of the heat-generating body, it is necessary to consider both the base and the fins; however, there is thought to be little consideration given to the temperature gradient in the base. Moreover, in Reference 4, the problem of durability, by making the base concave, arises.

SUMMARY OF THE PRESENT APPLICATION

The references above illustrate the problems (1) in that decreasing the thermal flux in the direction of the thickness of the base is impeded, and (2) at the same time the durability and reliability of the heat sink itself is lost. To solve these problems, the Present Application provides a heat sink, a cooling module and a coolable electronic board that, by effectively decreasing the temperature gradient in the base without losing durability or reliability, reduces temperature increases in the heat-generating body (or namely, increases the efficiency of cooling of the heat-generating body). Accordingly, the heat sink of the Present Application is provided with a base that faces a heat-generating body and absorbs heat from the heat-generating body, and is characterized in that the thermal resistance of the facing portion, facings the heat-generating body, is higher than the thermal resistance of the portion surrounding the facing portion.

With the Present Application, the temperature gradient within the base is reduced, thus suppressing the increase in temperature of the heat-generating body with room temperature as a reference. Moreover, with the heat sink of the Present Application, there is little loss in structural durability or reliability. In addition, the suppression of the temperature increase in the electronic components or devices that may be the heat-generating body also suppresses its deleterious effects upon the electronic boards, electronic equipment or the like in which they may be installed. As a result, this increases the performance and reliability.

The heat sink according to the Present Application is provided with a base that faces and absorbs heat from a heat-generating body, and in the base, the thermal resistance of the facing portion which faces the heat-generating body is higher than the thermal resistance of a surrounding portion which surrounds the facing portion. In this case, heat-conducting paths are constructed in parallel, so the heat flux $q_x$ in the interior of the base is reduced, and the temperature gradient in the base can be reduced. By reducing the temperature gradient, a temperature increase of the heat-generating body over room temperature is suppressed.

The heat sink according to the Present Application further comprises a facing portion made of a material with a higher thermal resistance than that of the surrounding portion. Further, the heat sink according to the Present Application further comprises a facing portion provided with a plurality of holes. With this configuration, the thermal resistance of the facing portion of the base becomes higher than the thermal resistance of the surrounding portion.

The heat sink according to the Present Application further comprises a base having a heat-receiving surface that faces the heat-generating body and a heat-radiating surface opposite the heat-receiving surface, and the thermal resistance of the fins provided upon a first region, which is the region of the heat-radiating surface corresponding to the facing portion, is higher than the heat resistance of the fins provided upon a second region, which is the region of the heat-radiating surface corresponding to the surrounding portion. With this configuration, the thermal resistance of the facing portion of the base and fins becomes higher than the thermal resistance of the surrounding portion. As a result, heat-conducting paths are constructed in parallel in the base and the fins. Because heat-conducting paths are constructed in parallel, the heat flux $q_x$ in the interior of the base is reduced, and thus the temperature gradient in the base and fins can be reduced.

The heat sink according to the Present Application further comprises a number of fins per unit of surface area provided in the first region fewer than the number of fins per unit of surface area provided in the second region. The heat sink according to the Present Application further comprises the aspect wherein the total volume of the fins provided in the first region is smaller than the total volume of the fins provided in the second region. With this configuration, the thermal resistance of the facing portion of the base and fins becomes higher than the thermal resistance of the surrounding portion. As a result, heat-conducting paths are constructed in parallel in the base and fins. Consequently, the heat flux $q_x$ in the interior of the base is reduced, as well as the temperature gradient in the base and fins.

The heat sink according to the Present Application further comprise zero fins in the first region. With this configuration, the thermal resistance of the facing portion becomes much higher than the thermal resistance of the surrounding portion. Also, construction becomes easy.

In the heat sink according to the Present Application, fins are further provided upon the side surfaces of the base which intersect the heat-radiating surface on the base. With this configuration, the thermal resistance of the facing portion becomes higher than the thermal resistance of the surrounding portion. In addition, the fins on the side surfaces actively disperse the heat from the heat-generating body in the planar direction. As a result, heat-conducting paths are constructed in parallel in the base and fins, so the heat flux can be reduced. Because the heat flux can be reduced, the temperature gradient in the base and fins can be reduced. Because the temperature gradient can be reduced, the increase in the temperature of the heat-generating body with respect to room temperature is suppressed.

The cooling module according to the Present Application comprises a flat plate-shaped base that has a heat-receiving surface and a heat-radiating surface, and a flat plate-shaped heat pipe disposed facing said heat-receiving surface, wherein, in the base, the thermal resistance of a facing portion which faces the flat plate-shaped heat pipe is higher than the thermal resistance of a surrounding portion which surrounds the facing portion, and the flat plate-shaped heat pipe cools a heat-generating body by means of the evaporation and condensation of a coolant sealed inside. With this configuration, the increase in the temperature of the heat-generating body can be further suppressed together with the flat plate-shaped heat pipe. In particular, heat-conducting paths are constructed in parallel in the interior of the base. Because heat-conducting paths are constructed in parallel, the heat flux $q_x$ in the interior of the base is reduced, and thus the temperature gradient in the base and fins can be reduced, so the increase in the temperature of the heat-generating body with respect to room temperature is suppressed.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which:

FIG. 19(a) illustrates an explanatory diagram illustrating the temperature distribution in a cross-section along Line A-A' of FIG. 12; and FIG. 19(b) is an explanatory diagram illustrating the temperature distribution in a cross-section along line A-A' of FIG. 14; and FIG. 20 illustrates a schematic diagram illustrating the temperature change in a heat sink and a heat-generating body.

DESCRIPTION OF THE PREFERRED EMBODIMENTS

Figure 1:
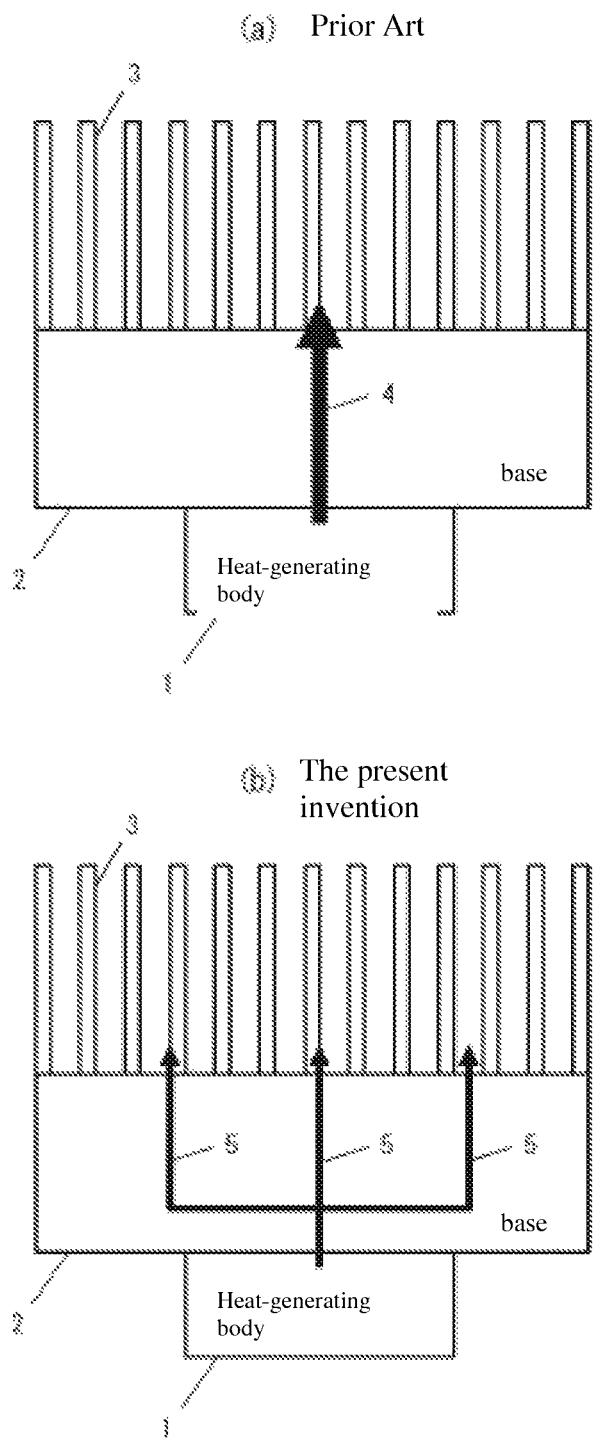
FIG. 1 illustrates a schematic diagram illustrating the concept of heat conduction.

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the embodiments illustrated in the Figures, representations of directions such as up, down, left, right, front and rear, used for explaining the structure and movement of the various elements of the Present Application, are not absolute, but relative. These representations are appropriate when the elements are in the position shown in the Figures. If the description of the position of the elements changes, however, these representations are to be changed accordingly.

As described in FIG. 20, the temperature difference between the heat-generating body and room temperature is determined as the sum of the temperature gradient arising between room temperature and the fins $\Delta T1$, the temperature gradient arising between the fins and the base $\Delta T2$, and the temperature gradient arising between the base and the heat-generating body $\Delta T3$. The temperature gradient between the outside environment and the fins is determined by convection heat transfer, so the rate of radiation of heat from the fins Q is calculated based on Newton's law of cooling, set forth as Equation 1:

$$Q = \int_A h\Delta T \, dA$$

Where h is the heat transfer coefficient [W/m2·K], A is the surface area of the fin [m2], and ΔT is the temperature difference between the temperature of the fin surface and room temperature [K] (or namely the temperature gradient).

As is clear from Equation 1, the rate of radiation Q is raised by increasing the heat transfer coefficient h or making the fin surface area A larger. On the other hand, ΔT2 and ΔT3 are determined by the conduction of heat in the fins and the interior of the base, so from Fourier's law of conduction, taking x to be the direction of heat conduction, for example, the heat flux $q_x$ in the direction x is given from Equation 2:

$$q_x = -k \frac{\partial T}{\partial x}$$

where k is the thermal conductivity [W/(m·K)].

Taking a first-degree approximation of Equation 2 gives Equation 3:

$$q_x \approx -k \frac{\Delta T}{\Delta x}$$

From Equation 3, the temperature gradient ΔT occurring at a heat-conducting path length of Δx is calculated from the following, set forth as Equation 4:

$$|\Delta T| \approx q_x \frac{\Delta x}{k}$$

where, $q_x$ is the heat flux and Δx/k (k is a constant determined depending on the substance) is the thermal resistance.

Equation 4 has a structure equivalent to that of Ohm's law by which the potential difference is obtained from the electrical resistance and current. For example, if the left-hand side |ΔT| is taken to be the potential difference, then the right-hand side $q_x$ corresponds to the current and Δx/k corresponds to the electrical resistance. The potential difference is determined by multiplying the current (corresponding to $q_x$ in Equation 4) by the electrical resistance (corresponding to Δx/k in Equation 4). In order to minimize the potential difference, it is necessary to do at least one of reduce the current or reduce the electrical resistance. If the potential difference is replaced with the temperature gradient ΔT, then as is clear from Equation 4, it is necessary to reduce at least one of the heat flux $q_x$ or the thermal resistance Δx/k.

Conventionally, effort has been focused on reducing the thermal resistance and little attention has been paid to the heat flux, as described above. Moreover, the heat sink is provided with the two elements of the fins and the base, but the base conducts heat not only in the direction of its thickness, but in the planar direction as well. Further, the conduction of heat in the planar direction of the base is virtually unconsidered. By addressing this issue, the Present Application utilizes parallel conduction of heat that also makes use of the planar direction of the base when the base conducts heat from the heat-generating body. Since the paths of heat conduction are parallel within the interior of the base, the heat flux $q_x$ becomes smaller than in the case of serial heat conduction. Thus, the heat flux $q_x$ in Equation 4 becomes smaller, and thus the temperature gradient ΔT within the base becomes small. Note that the thermal resistance Δx/k is determined by the thickness of the base and the physical properties of the substance that makes up the base, so making the heat flux $q_x$ small has no effect on the thermal resistance.

FIG. 1 is a schematic diagram illustrating the concept of heat conduction according to the Present Application. As is clear from FIG. 1(a), in the interior of the base 2, the heat from a heat-generating body 1 is conducted substantially in series to the center of the base which corresponds to the location where the heat-generating body 1 is mounted. The heat from the heat-generating body 1 is conducted to the fins 3 via a heat-conducting path 4. Because the heat is conducted substantially in series to the fins 3 via the heat-conducting path 4, the value of the heat flux $q_x$ in the heat-conducting path 4 is large (by the same principle by which the value of the current becomes large in the case of a series electrical connection).

In contrast, as is clear from FIG. 1(b), with the Present Application, the heat from the heat-generating body 1 travels through the interior of the base 2 in a parallel manner distributed in the direction of thickness (or namely, also distributed in the planar direction). As shown in FIG. 1(b), heat-conducting paths 5 are distributed in parallel. Since the heat-conducting paths 5 are distributed in parallel, the values of the heat flux $q_x$ in each of the distributed heat-conducting paths become smaller (by the same principle by which the value of the current becomes smaller in the case of a parallel electrical connection). As described above, the thermal resistance is determined solely by the physical properties and the thickness of the base 2, so if the heat flux q, becomes small, then the temperature gradient in the base 2 becomes small.

Conventionally, there was no concept of decreasing the temperature gradient in the base by decreasing the value of the heat flux $q_x$ by making use of the planar direction of the base 2 in this manner. If the temperature gradient in the base is decreased, then this suppresses the increase in the temperature of the heat-generating body, which is calculated as the sum of the temperature gradients at the boundaries of from the heat-generating body to the base, from the base to the fins, and from the fins to the outside environment.

The theory that supports the Present Application was developed by applying logical studies to the aforementioned problem of conventional heat sinks. This theory is conceptually illustrated by FIG. 1, and implemented as described below.

Figure 2:
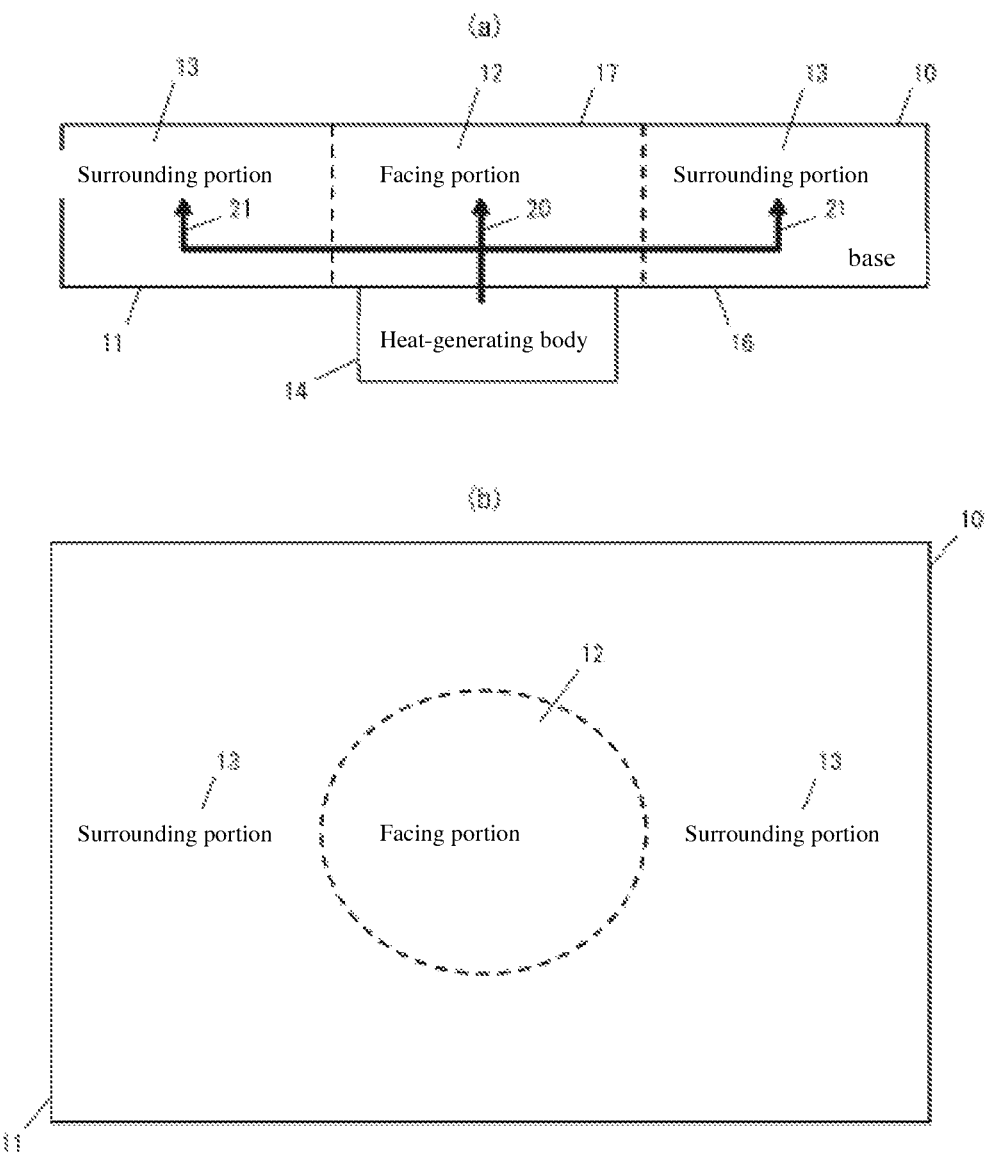
FIG. 2(a) illustrates a side view of a heat sink of the Present Application.
FIG. 2(b) illustrates a top view of the heat sink of FIG. 2(a)

Referring to FIG. 2, the heat sink 10 shown in FIG. 2(a) is provided with a base 11. The base 11 is provided with a heat-receiving surface 16 and a heat-radiating surface 17, where the heat-receiving surface 16 faces a heat-radiating body 14. The heat-radiating body 14 may be a semiconductor integrated circuit, LED device, power device or other electronic component or device. In FIG. 2, the heat-radiating body 14 is illustrated as a single unit, but it may include a plurality of components or devices.

The base 11 is in contact with the heat-radiating body 14 at the heat-receiving surface 16, absorbing heat from the heat-radiating body 14. The base 11 conducts heat from the heat-radiating body 14 to the heat-radiating surface 17. In this example, the base 11 is provided with a facing portion 12 which faces the heat-radiating body 14 and a surrounding portion 13 which surrounds the facing portion 12. The value of the thermal resistance (Δx/k in Equation 4) of the facing portion 12 is higher than the thermal resistance of the surrounding portion 13.

Were the thermal resistance of the base 11 to be uniform over the entire base 11, the heat-conducting paths would be in series as shown in FIG. 1(a). However, as shown in FIG. 2, the thermal resistance of the facing portion 12 is higher than the thermal resistance of the surrounding portion 13, so the heat from the heat-radiating body 14 is naturally distributed within the surrounding portion of the base 11. This is because the heat from the heat-radiating body 14 attempts to escape to the surrounding portion 13 which has a lower thermal resistance. As a result, parallel heat-conducting paths readily form.

FIG. 2(a) illustrates heat-conducting paths 20 and 21. The heat-conducting path 20 in the facing portion 12 conducts heat directly from the heat-radiating body 14 in the direction of the thickness of the base 11. On the other hand, the heat-conducting paths 21 in the surrounding portion 13 are distributed in the planar direction from the heat-radiating body, and thus conduct heat to the heat-radiating surface 17. In this manner, in the base 11, heat-conducting paths are formed in parallel between the heat-conducting path 20 in the facing portion 12 and the heat-conducting paths 21 in the surrounding portion 13.

As is clear from the explanation of the concept of the Present Application and from Equation 4, when there are parallel heat-conducting paths, the heat flux $q_x$ becomes smaller. As a result, the temperature gradient in the base 11 becomes smaller, and the increase in the temperature of the heat-radiating body 14 compared to room temperature is suppressed.

Figure 3:
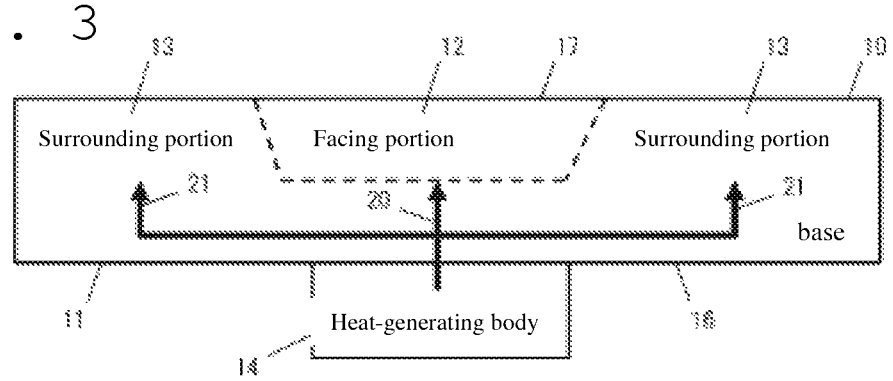
FIG. 3 illustrates a side view of the heat sink of FIG. 2(a)

The heat sink 10 in FIG. 3 has the facing portion 12 made of a material that has a higher thermal resistance than that of the surrounding portion 13. The base 11 is often made of metal or resin, but by combining blocks made of different materials, it is possible to form a base 11 such that the thermal resistance of the facing portion 12 has a higher value than the thermal resistance of the surrounding portion 13. Alternatively, it is possible to make the thermal resistance of the facing portion 12 higher than the thermal resistance of the surrounding portion 13 in a base 11 that is formed as a unit by doping the facing portion 12 with impurities. As is clear from FIG. 3, in this case also, the heat from the heat-radiating body 14 is forcibly distributed into the surrounding portion 13, so parallel heat-conducting paths are formed. To wit, the heat from the heat-radiating body 14 is conducted into both of the parallel paths comprising heat-conducting path 20 in the facing portion 12 and heat-conducting paths 21 in the surrounding portion 13. In this manner, parallel heat-conducting paths are formed, so the heat flux $q_x$ becomes small, and as a result, the temperature gradient in the base 11 becomes smaller. Examples of materials that have a high thermal resistance include PEEK and other engineering plastics. Also, examples of materials that have a low thermal resistance include copper, aluminum and other metal materials.

Figure 4:
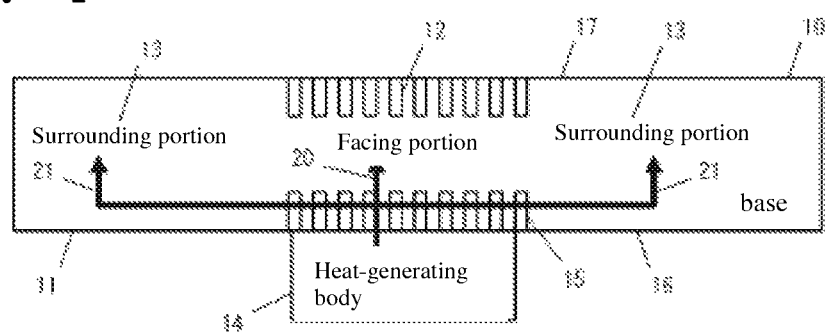
FIG. 4 illustrates a side view of the heat sink of FIG. 2(a)

In order to form parallel heat-conducting paths in the base 11, it is effective to provide a plurality of holes in the facing portion 12 of the base 11 as shown in FIG. 4. Accordingly, a plurality of holes 15 is provided upon both the heat-radiating surface 17 and the heat-receiving surface 16 in the facing portion 12 of the base 11. Since a plurality of holes 15 is provided, the facing portion 12 contains a region that is occupied by air. The thermal resistance of air is large, and as a result, the thermal resistance of the facing portion 12 becomes larger than the thermal resistance of the surrounding portion 13 where no holes are provided. As a result, in the same manner as the heat sink illustrated in FIGS. 2-3, parallel heat-conducting paths are formed in the interior of the base 11, and the heat flux $q_x$ is decreased. By providing a plurality of holes 15 in the facing portion 12 as in the heat sink illustrated in FIG. 4, it is easy to change the heat resistance in the base 11 without forming a separate body or making it of different materials.

Note that the plurality of holes 15 may be provided upon only one of the heat-receiving surface 16 or the heat-radiating surface 17, or they may be provided upon each of them. In addition, they may be holes carved from the surface, or they may be voids formed in the interior of the base 11. In addition, the base 11 may be formed as a unit or it may be formed by combining a plurality of blocks.

As described above, the heat-conducting paths from the heat-radiating body 14 are distributed in parallel, and thus the heat flux in the interior of the base 11 can be reduced. By reducing the heat flux in this way, the temperature gradient in the base 11 is decreased, so the increase in temperature of the heat-radiating body 14 with respect to room temperature can be suppressed. Note that the base 11 is preferably made using copper, aluminum, tungsten, titanium or other metal with high thermal conductivity, or a resin with superior resistance to heat.

Figure 5:
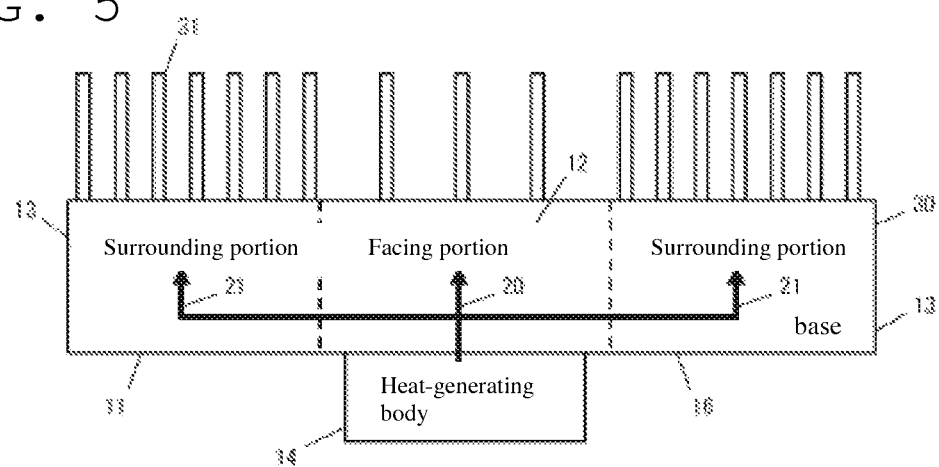
FIG. 5 illustrates a side view of a heat sink of the Present Application.
Figure 6:
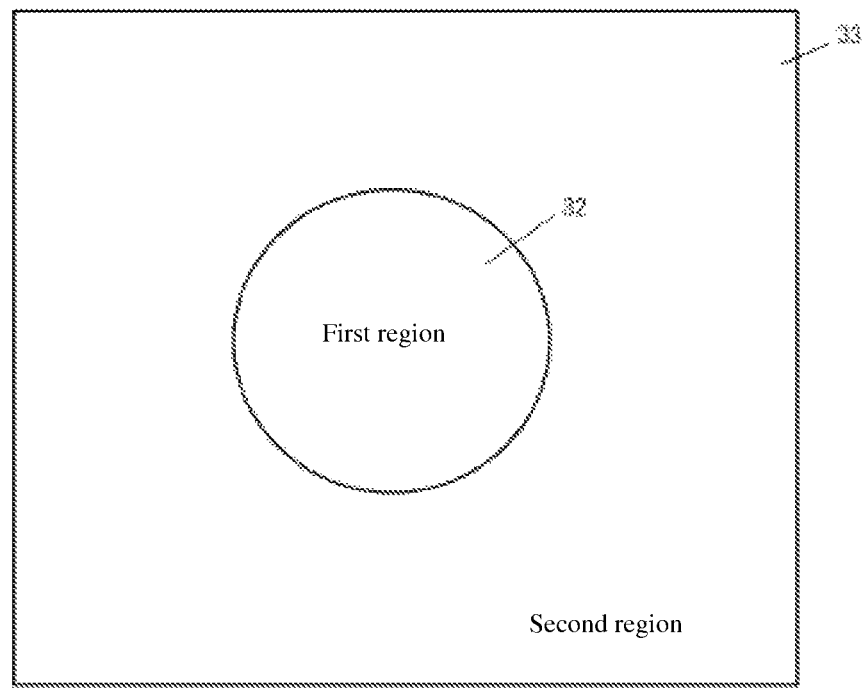
FIG. 6 illustrates a top view of the heat sink of FIG. 5.

Referring to FIGS. 5-6, a heat sink 30 is provided with a base 11 and a plurality of fins 31 provided upon the heat-radiating surface 17 of the base 11. As previously described, the base 11 preferably has higher thermal resistance in the facing portion 12 than in the surrounding portion 13. However, the heat sink 30 described above includes modifications to the fins 31 so that the heat-conducting paths within the interior of the base 11 are distributed in parallel, so the base 11 when taken alone may have a uniform thermal resistance. The heat-radiating surface 17 has a first region 32 corresponding to the facing portion 12 and a second region 33 corresponding to the surrounding portion 13, while the fins 31 are provided so as to protrude from the first region 32 and the second region 33.

Here, the thermal resistance of the fins 31 provided upon the first region 32 is higher than the thermal resistance of the fins 31 provided upon the second region 33. Since the thermal resistance of the fins 31 provided upon the first region corresponding to the facing portion 12 is higher in addition/in lieu of the base 11, heat from the heat-radiating body 14 is distributed in the planar direction within the base 11 and conducted in parallel. As a result, the heat flux q, becomes smaller and the temperature gradient in the base 11 becomes smaller. In addition, the temperature gradient in the fins 31 provided upon the heat-radiating surface 17 of the base 11 also becomes smaller. By making modifications to the fins 31 in this manner, by expanding the conduction of heat in the planar direction in the same manner as previously described, the heat flux can be decreased and as a result the increase in the temperature of the heat-radiating body 14 compared to room temperature can be suppressed.

In order to make the thermal resistance of the fins 31 in the first region 32 higher than the thermal resistance of the fins 31 in the second region, it is sufficient to use different materials for the fins in the first region 32 and the second region 33, or to vary the number of fins 31, or to vary the total volume of the fins 31. For example, as shown in FIG. 5, the number of fins 31 in the first region 32 is made fewer than the number of fins 31 in the second region 33. By making the number of fins 31 in the first region 32 fewer than the number of fins 31 in the second region 33, the heat from the heat-radiating body 14 moves readily toward the second region 33 which has a lower thermal resistance. As a result, after the heat from the heat-radiating body 14 is received at the heat-receiving surface 16 of the base 11, it moves in the planar direction of the base 11 and is conducted in parallel through the interior of the base 11. Moreover, the heat is conducted from the base 11 to the fins 31 and radiated from the fins 31. At this time, the paths for the heat that is conducted through the interior of the base 11 and fins 31 are distributed and thus parallel, so the heat flux $q_x$ becomes small. If so, the temperature gradient in the base 11 and fins 31 becomes small as is clear from Equation 4. If the temperature gradient is small, then the increase in the temperature of the heat-radiating body 14 compared to room temperature can be decreased. As a result, the heat sink 30 demonstrates that the cooling effect upon the heat-radiating body 14 is high.

In addition, as shown in FIG. 5, the fact that the number of fins 31 in the first region 32 is fewer than the number of fins 31 in the second region 33 indicates that the total volume of the fins 31 in the first region 32 is smaller than the total volume of the fins 31 in the second region 33. To wit, in order to distribute the heat from the heat-radiating body 14 in the planar direction of the base 11 and make the heat flux $q_x$ small, this can be achieved by decreasing the total volume of the fins 31 in the facing portion that faces the heat-radiating body 14.

Figure 7:
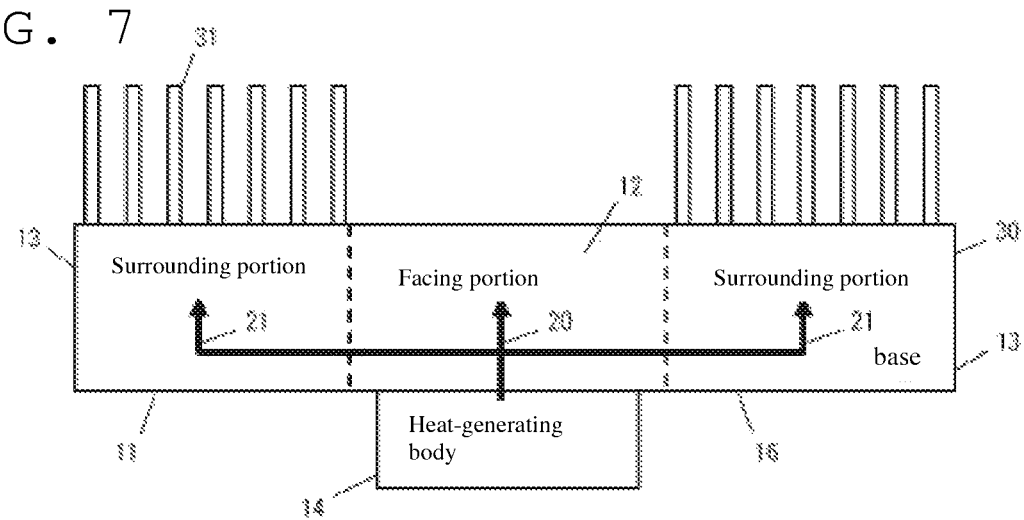
FIG. 7 illustrates a side view of the heat sink of FIG. 5.

In addition, it is preferable for the number of fins in the first region 32 to be zero, as shown in FIG. 7. In other words, no fins 31 are provided in the first region 32. In this manner, when absolutely no fins 31 at all are provided upon the region facing the heat-radiating body 14, the heat from the heat-radiating body 14 readily moves in the planar direction within the interior of the base 11. As a result, the heat-conducting paths in the interior of the base 11 are divided between the heat-conducting path 20 in the facing portion 12 and the heat-conducting paths 21 in the surrounding portion 13. If there are parallel heat-conducting paths, the heat flux $q_x$ will naturally become smaller. If the heat flux $q_x$ is made smaller, the temperature gradient also becomes smaller. In this manner, by providing absolutely no fins 31 at all upon the first region 32, it is possible to suppress the increase in the temperature of the heat-radiating body 14 and thus increase the effect of cooling the heat-radiating body 14.

Note that a heat sink with no fins 31 provided does not exclude a heat sink that has surface irregularities upon the first region 32 occurring due to design considerations, and does not exclude a heat sink with fins provided in the first region to such an extent that they do not interfere with the gist of the Present Application. Alternatively, the heat sink may have fins provided on the side surfaces of the base.

Figure 8:
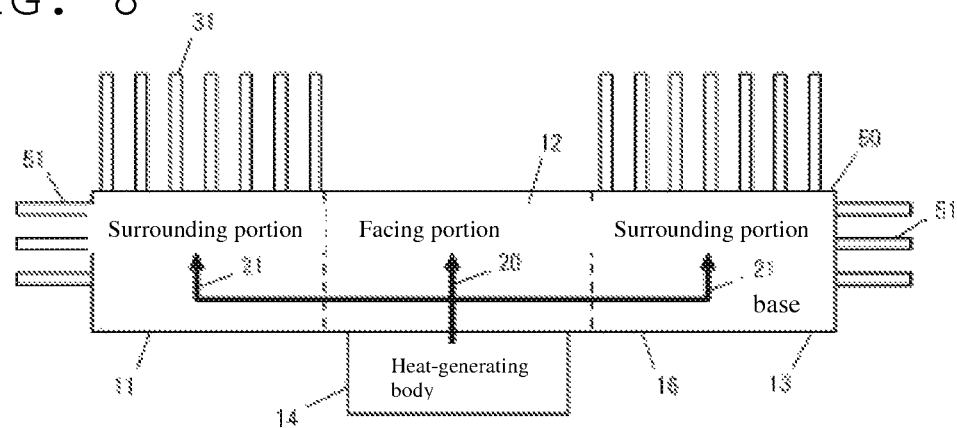
FIG. 8 illustrates a side view of a heat sink of the Present Application.

Referring to the heat sink 50 of FIG. 8, fins 51 are provided on the side surfaces of the base 11 which intersects the heat-radiating surface. Other than providing fins 51 on the side surfaces, the constitution is common to that described above. By fins 51 being provided upon the side surfaces, the heat from the heat-radiating body 14 moves readily in the planar direction within the base 11. Further, since fins 51 are provided upon the side surfaces, the thermal resistance becomes less than that of the first region 32 on which fins 51 are not provided (because heat becomes more readily attracted if the objects called fins 51 are provided), and the heat from the heat-radiating body 14 moves not in the direction of thickness toward the first region 32 but rather in the direction toward the side surfaces (or namely in the planar direction).

This is due not only to the fact that the thermal resistance of the facing portion of the base 11 becomes lower than the thermal resistance of the surrounding portion, but also the fact that the fins 51 provided upon the side surfaces actively disperse heat from the heat-radiating body 14 in the planar direction. To wit, by fins 51 being provided upon the side surfaces of the base 11, the heat from the heat-radiating body 14 is actively dispersed in the planar direction in the interior of the base 11. This indicates the same action of dispersion of heat regardless of whether fins 31 are provided on the heat-radiating surface or whether only the fins 51 are on the side surfaces are provided. For this reason, the heat from the heat-radiating body 14 is conducted via parallel heat-conducting paths dispersed within the base 11. The heat-conducting paths are parallel, so the heat flux $q_x$ in the direction of the thickness of the base 11 becomes small. Because the heat flux $q_x$ is small, the temperature gradient at the base 11 calculated as the integral of the heat flux and thermal resistance also becomes small. The temperature of the heat-radiating body 14 is calculated as the sum of the temperature gradients from room temperature to the fins, from the fins to the base, and from the base to the heat-generating body. Thus, if the temperature gradient is small, then the increase in the temperature of the heat-radiating body 14 becomes small.

With the heat sink 50, by providing fins 51 on the side surfaces of the base 11, the heat flux $q_x$ in the base 11 is decreased. As a result, the heat sink 50 in Embodiment 3 can suppress the increase in temperature of the heat-radiating body 14. To wit, the heat sink 50 has an excellent cooling effect.

Figure 9:
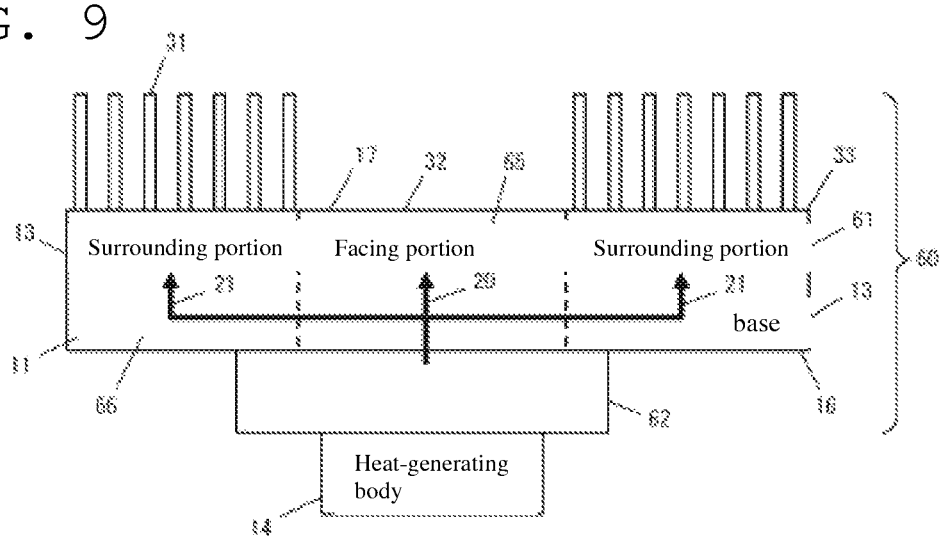
FIG. 9 illustrates a side view of a cooling module of the Present Application.
Figure 10:
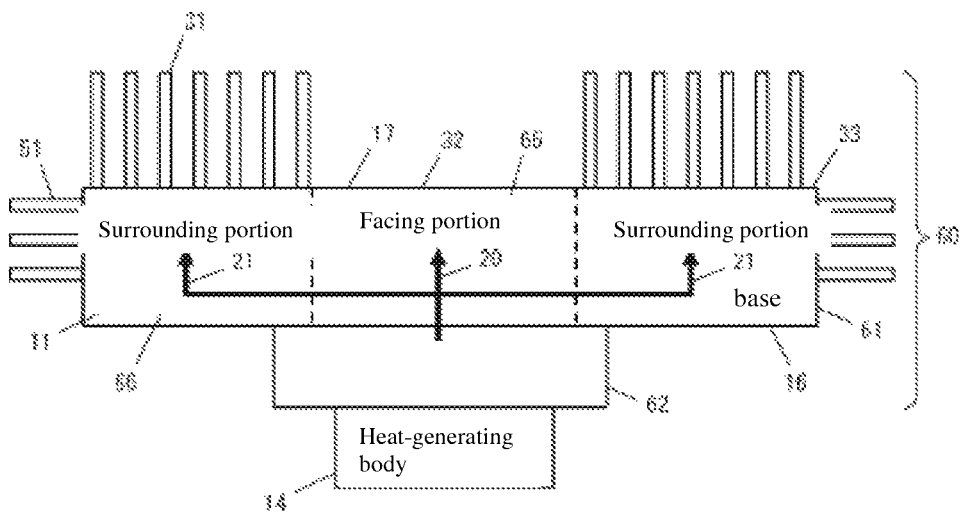
FIG. 10 illustrates a side view of the cooling module of FIG. 9.

Referring to FIGS. 9-10, a cooling module is described that combines a heat pipe that cools a heat-generating body by means of the evaporation and condensation of a coolant sealed inside with one of the heat sinks described above. The cooling module 60 is provided with a heat sink 61 and a flat plate-shaped heat pipe 62. The flat plate-shaped heat pipe 62 is disposed facing the heat-receiving surface 16 of the heat sink 61. At this time, the mutually facing surfaces are coated with a thermal grease or other thermal bonding agent.

As is clear from FIGS. 9-10, the heat-radiating body 14 is in contact with the flat plate-shaped heat pipe 62 and the heat sink 61 is in contact with the flat plate-shaped heat pipe 62. For this reason, the heat conduction from the heat-radiating body 14 proceeds to the heat sink 61 via the flat plate-shaped heat pipe 62. To wit, the cooling module 60 in Embodiment 4 cools the heat-radiating body by the flat plate-shaped heat pipe 62 and the heat sink 61 working together.

In comparison to the case of the heat sink 61 alone, it is possible to cool the heat-radiating body 14 even more effectively by adding the flat plate-shaped heat pipe 62 which is able to receive heat by means of a coolant. The flat plate-shaped heat pipe 62 is formed by laminating a plurality of plates so as to have an empty space inside. Its shape is that of a flat plate. The internal empty space is filled with coolant. The coolant is normally a liquid which resides upon the bottom surface of the flat plate-shaped heat pipe 62 (the heat-receiving surface in contact with the heat-radiating body 14). The heat from the heat-radiating body 14 is conducted to this bottom surface and vaporizes the coolant which had been a liquid; the vapor then moves to the upper surface of the flat plate-shaped heat pipe 62 (the heat-radiating surface in contact with the heat sink 61). The heat from the heat-radiating body 14 is carried by means of this movement of vaporized coolant. To wit, with the cooling module 60, the heat sink 61 cools the heat-radiating body 14 together with this flat plate-shaped heat pipe 62.

The heat sink 61 receives the heat of the heat-radiating surface of the flat plate-shaped heat pipe 62 upon its heat-receiving surface 16, and conducts heat by means of the mechanism described above. When heat is radiated by the heat sink 61, the temperature of the heat-radiating surface of the flat plate-shaped heat pipe 62 drops, and the vaporized coolant condenses and returns to liquid form. The coolant that has returned to liquid form drips down due to its weight and returns back to the lower surface of the flat plate-shaped heat pipe 62. The returned liquid coolant is again vaporized by heat from the heat-radiating body 14 and thus performs the movement of heat. By repeating this vaporization and condensation of coolant, the flat plate-shaped heat pipe 62 is able to cool the heat-radiating body 14.

The flat plate-shaped heat pipe 62 absorbs heat from the heat-radiating body 14 using coolant, so the cooling module 60 has a higher cooling efficiency than in the case of using the heat sink 61 alone. Naturally, since the heat sink 61 is added, the heat from the heat-radiating surface of the flat plate-shaped heat pipe 62 is efficiently radiated, so the cooling module 60 has a higher cooling efficiency than in the case of using the flat plate-shaped heat pipe 62 alone. In other words, one may consider the flat plate-shaped heat pipe 62 and the base 11 of the heat sink 61 to be a single base.

In the cooling module 60, the heat from the heat-radiating body 14 conducted by the flat plate-shaped heat pipe 62 is radiated by the heat sink 61. To wit, the flat plate-shaped heat pipe 62 and heat sink 61 act as a single unit to cool the heat-radiating body 14 (suppressing the increase in temperature of the heat-radiating body 14 relative to room temperature).

In the heat sink 61, the portion of the heat-receiving surface 16 that faces the flat plate-shaped heat pipe 62 is called the facing portion 65, while the portion other than the facing portion 65 is called the surrounding portion 66. As previously described, the heat sink had been in direct contact with the heat-radiating body 14, so the portion facing the heat-radiating body 14 was called the facing portion 12. However, the heat sink 61 absorbs heat from the flat plate-shaped heat pipe 62, so the facing portion 65 and surrounding portion 66 are defined using the flat plate-shaped heat pipe 62 as the basis. Note that the facing portion 65 and the surrounding portion 66 are merely determined based on the portions facing the flat plate-shaped heat pipe 62, so there is no need for them to be finely divided. It is sufficient for the general distinction to be known. This also applies to the facing portion 12 and the surrounding portion 13 described above. In each case, it is sufficient to know that the general portion of the heat-receiving surface 16 that faces the heat-radiating body 14 or the flat plate-shaped heat pipe 62 is the facing portion.

In the cooling module 60 as well, the thermal resistance of the facing portion 65 of the base 11 is higher than the thermal resistance of the surrounding portion 66. This is achieved by means of the materials or structure of the base 11 (whether the facing portion 65 has a plurality of holes or voids, etc.). Alternatively, this may be achieved by the shape of the fins 31 or 51 as shown in FIGS. 9-10. For example, the material forming the facing portion 65 may be different from the material forming the surrounding portion 66, so the value of the thermal resistances of each may be different. This is because the value of the thermal resistance is determined by the physical properties of the material. Thus, it is sufficient to form the facing portion 65 from a material having the physical property of high thermal resistance, and form the surrounding portion 66 from a material having the physical property of low thermal resistance. In this case, it would be manufactured by combining separate units.

Alternatively, it may be formed as a unit from a single material, and then the facing portion 65 may be doped with impurities to cause the thermal resistance of the facing portion 65 to be higher than the thermal resistance of the surrounding portion 66. In addition, in the same manner as illustrated in FIG. 4, a plurality of holes may be provided in the surface of the facing portion 65, or voids may be provided in the interior, to increase the thermal resistance of the facing portion 65. Alternatively, the number of fins formed upon the facing portion 65 may be reduced or no fins may be provided, in order to make the thermal resistance of the facing portion 65 greater than the thermal resistance of the surrounding portion 66.

By making the thermal resistance of the facing portion 65 higher, the heat from the heat-radiating body 14 that is conducted via the flat plate-shaped heat pipe 62 is conducted in a parallel manner through the base 11. As a result, the heat flux $q_x$ of the base 11 becomes small and the temperature gradient in the heat sink 61 is reduced. The temperature of the heat-radiating body 14 is calculated as the sum of the temperature gradients from room temperature, so if the temperature gradients in the heat sink 61 are reduced, then the increase in the temperature of the heat-radiating body 14 is suppressed.

The number or total volume of the fins 31 upon the first region 32 corresponding to the facing portion 65 of the heat-radiating surface 17 may also be made smaller than the number or total volume of the fins 31 upon the second region 33. Moreover, as shown in FIG. 9, it is also possible to provide no fins 31 upon the first region 32. Note that providing no fins 31 does not exclude providing surface irregularities arising in manufacture, or small fins of such extent that they do not interfere with the gist of the Present Application.

In addition, fins 51 may be provided upon the side surfaces of the base 11 as shown in FIG. 10. In this manner, by making modifications to the fins provided upon the heat sink 61, the thermal resistance of the facing portion 65 is made higher than the thermal resistance of the surrounding portion 66. Even if the material and structure of the base 11 itself are not different, the fins 31 or 51 have the effect of removing heat from the flat plate-shaped heat pipe 62, so the thermal resistance of the facing portion 65 becomes higher than the thermal resistance of the surrounding portion 66. To wit, due to the structure of the fins 31 and 51, the heat from the flat plate-shaped heat pipe 62 is conducted through the base 11 via parallel paths. To wit, there are parallel heat conduction paths in the base 11, so the heat flux $q_x$ in the heat sink 61 becomes small. As a result, the temperature gradient in the heat sink 61 can be reduced.

As described above, the cooling module is also able to cool the heat-radiating body 14 with high efficiency because it is able to decrease the heat flux $q_x$. Note that, also, in order to make the heat conduction paths parallel, it is possible to use one or the other of modifications to the material or structure of the base itself, or modifications to the structure of the fins, or a combination of the two. In addition, the cooling module 60 may comprise a combination of a heat sink 61 and a flat plate-shaped heat pipe 62, or it may comprise a heat sink 61.

Figure 11:
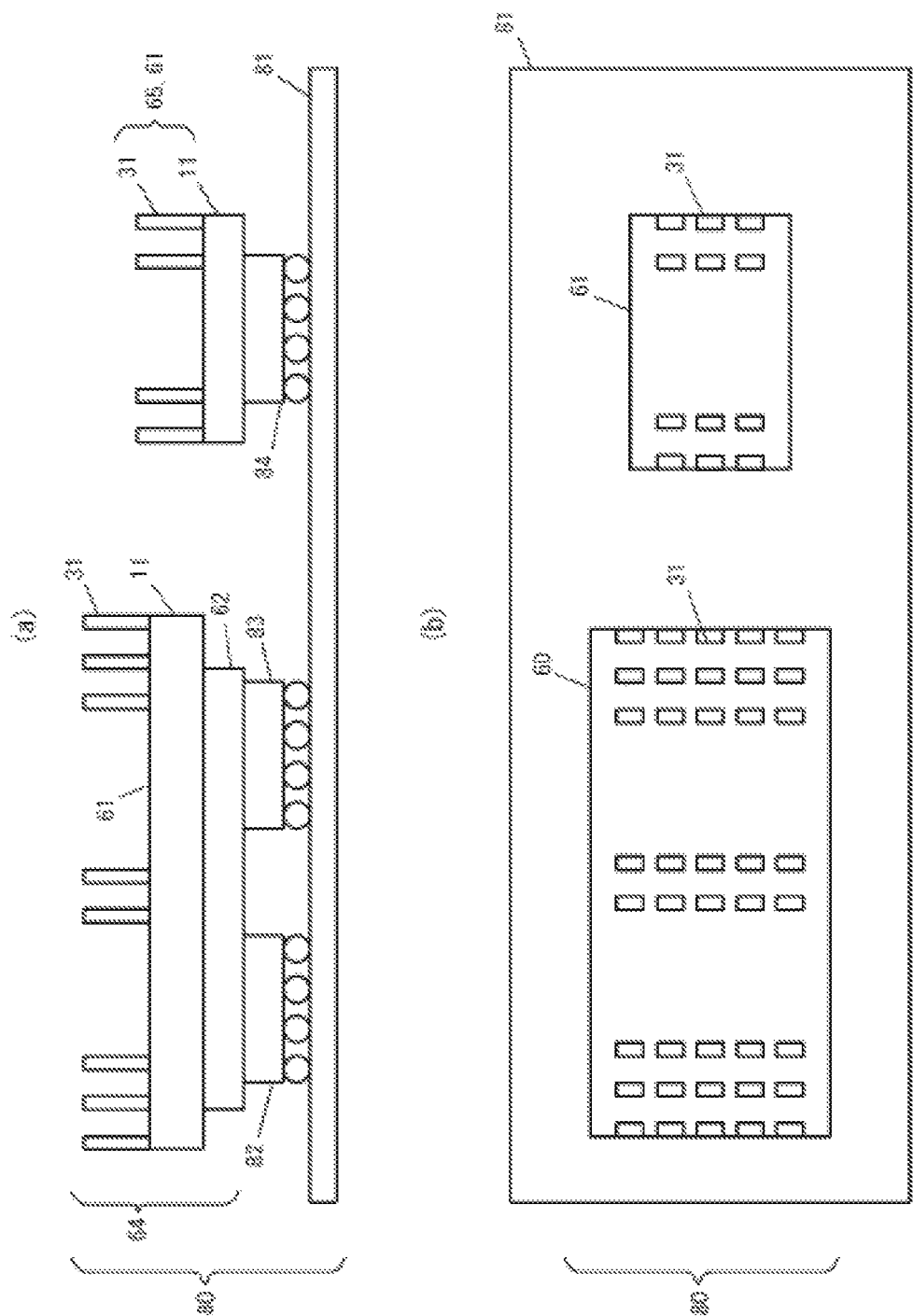
FIG. 11(a) illustrates a side view of a coolable electronic board of the Present Application.
FIG. 11(b) illustrates a top view of the coolable electronic board of FIG. 11(a)

Referring to FIG. 11, the coolable electronic board 80 is provided with an electronic board 81 upon which are mounted electronic components 82, 83 and 84, a cooling module 64 disposed so as to face electronic components 82 and 83, and a cooling module 65 disposed so as to face electronic component 84. Note that as shown in FIG. 11, the cooling module 64 disposed facing components 82 and 83 is a combination of a heat sink 61 and a flat plate-shaped heat pipe 62, but the cooling module 65 disposed facing component 84 comprises a heat sink 61. The decision of whether to use a cooling module 65 having a heat sink 61 only or a cooling module 64 that combines a heat sink 61 with a flat plate-shaped heat pipe 62 may be made depending on the degree of heat generated by the component or the amount of space available required to install the cooling modules 64 or 65. Each of the electronic components 82, 83 and 84 generates heat.

The cooling module 64 is disposed so as to face both electronic components 82 and 83. The cooling module 64 simultaneously cools the two electronic components. On the other hand, cooling module 65 is disposed so as to face one electronic component 84. The cooling module 65 cools only a single electronic component.

The heat sink 61 provided in the cooling module 64 is provided with fins 31 in regions other than the portions of the heat-radiating surface of the heat sink 61 that face the electronic components 82 and 83. This is the same as that described above. Similarly, the heat sink 61 provided in the cooling module 64 is also provided with fins 31 in regions other than the portion that faces the electronic component 84.

With such a configuration of fins, in the base 11 constituting the heat sink 61, the heat-conducting paths are made parallel and the heat flux $q_x$ is decreased. By decreasing the heat flux $q_x$, the temperature gradient at the heat sink 61 is also decreased, so the increase in the temperature of the electronic components 82-84 relative to room temperature can be suppressed.

In this manner, the coolable electronic board 80 can cool the heat-generating electronic components mounted therein in a highly efficient manner. This is because, since the cooling modules 64 and 65 are mounted, the increase in the temperature of the electronic components can be suppressed even in the case in which the electronic board 80 is installed in electronic equipment, industrial equipment or the like. Note that the cooling modules 64 and 65 illustrated in FIG. 11 are only a single example, and naturally it is possible to use other cooling modules that have other shapes and configurations as described above. Also, note that by reducing the temperature gradient in the heat sinks, the heat sinks and cooling modules described above also reduce the temperature gradients in the heat-generating bodies and flat plate-shaped heat pipes in which they are in contact.

Figure 12:
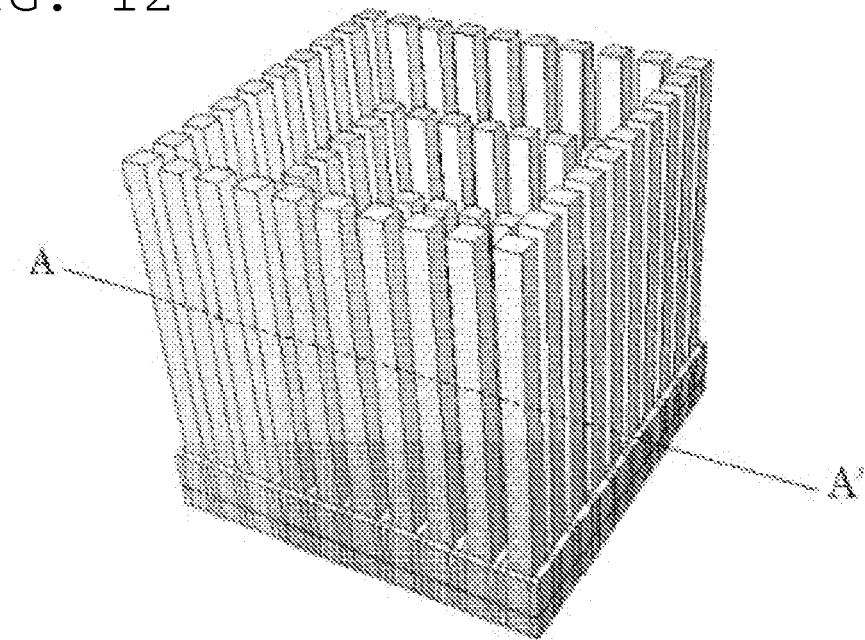
FIG. 12 illustrates an oblique view of a heat sink of the Present Application.
Figure 13:
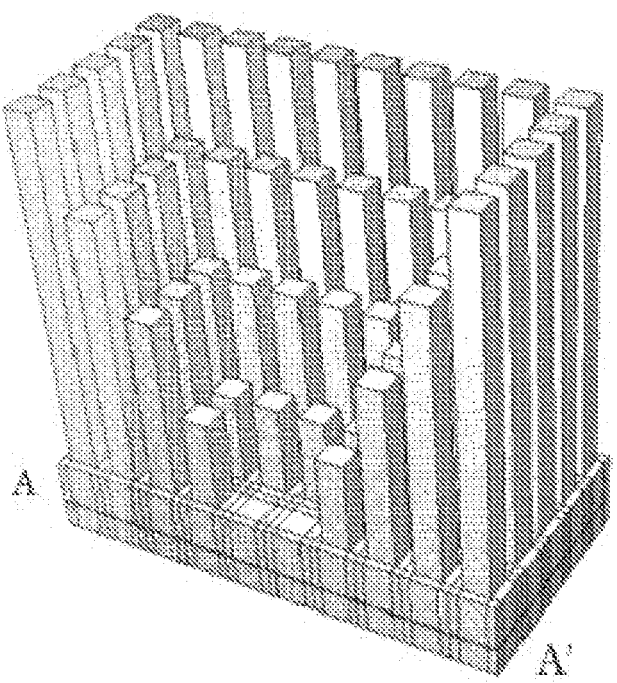
FIG. 13 illustrates an oblique view of the heat sink of FIG. 12.
Figure 14:
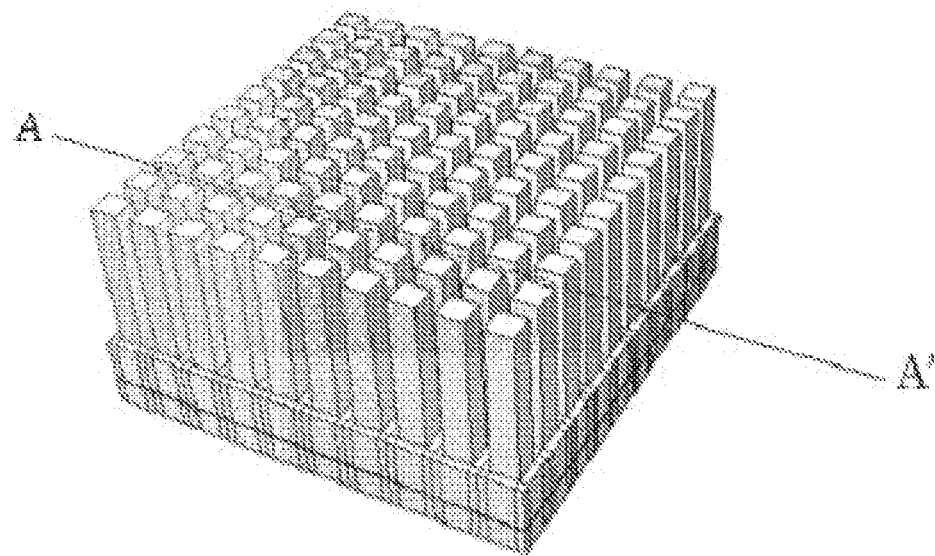
FIG. 14 illustrates an oblique view of a heat sink of the Present Application.
Figure 15:
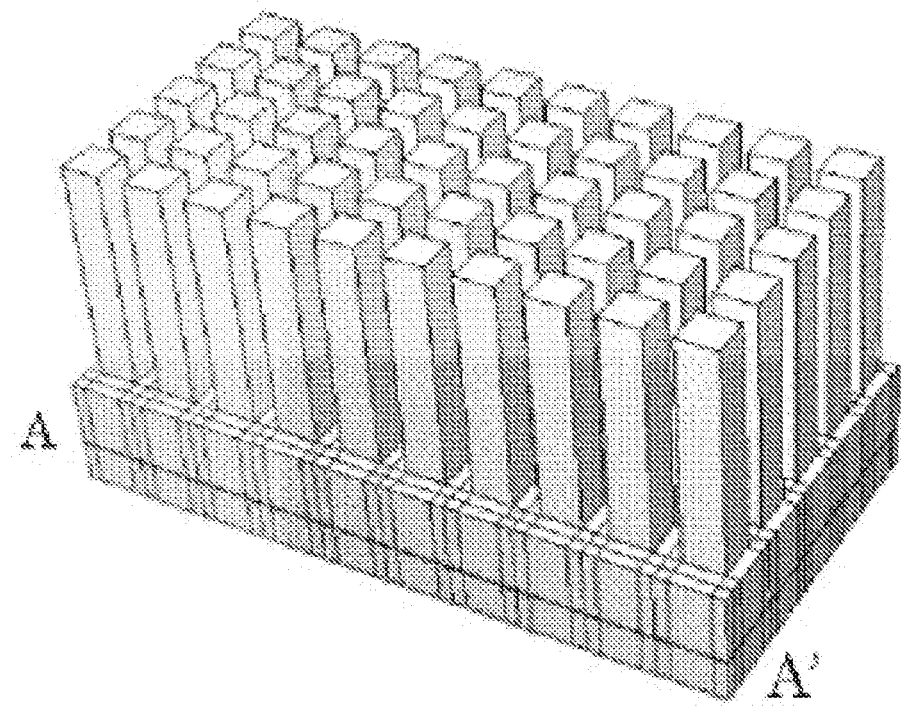
FIG. 15 illustrates an oblique view of the heat sink of FIG. 14.

Referring to FIGS. 12-5, an experiment was conducted in regard to a cooling module that combines a heat sink and a flat plate-shaped heat pipe. The heat-generating body is cooled by the heat sink and a flat plate-shaped heat pipe as a unit (which may be considered a base that combines a flat plate-shaped heat pipe and a heat sink). The heat sink is one of the heat sinks described above, which can reduce the temperature gradient in comparison to a conventional heat sink, regardless of whether or not it is combined with a flat plate-shaped heat pipe.

The heat sink illustrated in FIGS. 12-3 has no fins provided in the central area of the base generally thought to be the facing portion that faces the heat-generating body, while fins are provided only in the surrounding portion. In addition, the heights of the fins become taller toward the peripheral area.

The heat sinks of FIGS. 12-5 are envisioned to be made of aluminum. Note that other than aluminum, they may also be made of copper, silver, gold, titanium or other metal with high thermal conductivity, or a resin. Further, the bases of the heat sinks are of a size 5 mm thick and 50 mm square. The fins are 3 mm square and are disposed at a pitch of 5 mm, protruding upward. The height of the fins is 40 mm in the outermost periphery, 30 mm on the next-inside rank, 20 mm on the next-inside rank and 10 mm on the innermost rank. The region with no fins provided is a region measuring 12 mm square in the center of the base. This is equivalent to the first region as described above. This 12-mm square first region may be appropriately modified depending on the size of the heat-generating body. In addition, the heights of the fins need not increase in a linear fashion from the center toward the outside periphery as described above, but rather they may increase in a manner approximating that of a conic section, or they may increase in a manner approximating that of a root-function curve.

Note that the pattern of increase in the heights of the fins may be determined depending on the air currents from a fan that is combined with the heat sink. For example, in the case in which air is blown down upon the heat sink from above, having the heights of the fins vary so as to draw a concave shape when seen in the cross-section of the heat sink is effective in drawing in air currents. Conversely, if a fan that sucks air upward to above the heat sink is used, having the heights of the fins vary so as to draw a convex shape when seen in the cross-section of the heat sink is effective in drawing in air currents. By means of a constitution whereby the heights of the fins vary linearly as shown in FIG. 12, it is possible to minimize differentials in the change in performance due to different fans.

The material of the heat sink and the size of the base are the same, but the only difference is that fins with a height of 40 mm are disposed at a 5 mm pitch over the entire surface of the heat-radiating surface. In addition, the heat sinks are combined with a flat plate-shaped heat pipe. In this case, the heat sink and flat plate-shaped heat pipe are connected with thermal grease or another thermal interface material (hereinafter called "TIM") interposed between. The TIM preferably has a thickness of roughly 0.1 mm. Examples of TIM include silicon-based thermal greases, as well as thermal greases that contain fillers of copper or silver particles, epoxy-based thermal greases that harden under stipulated temperature and time conditions, and thermal greases that undergo phase changes and become fluid at temperature abnormalities and various materials including liquid metals. Note that silicon-based thermal greases are inexpensive and advantageous. In addition, the flat plate-shaped heat pipe is made using copper.

The method of simulation adopted a solid-interior model to which the three-dimensional heat conduction formulae were discretized by means of the finite volume method. In addition, a model was adopted wherein, over the heat sink surface, the heat transfer coefficient for vertical surfaces was set to a constant of 200 W/(m2·K), the heat transfer coefficient for upward-facing horizontal surfaces was set to a constant of 150 W/(m2·K) and the heat transfer coefficient for downward-facing horizontal surfaces was set to a constant of 10 W/(m2·K). This was done in consideration of the stability of calculation. In addition, the heat transfer coefficient for the flat plate-shaped heat pipe was set to 1700 W/(m2·K), roughly 5 times the heat transfer coefficient of copper, because this is thought to be appropriate for the performance of the flat plate-shaped heat pipe.

Figure 16:
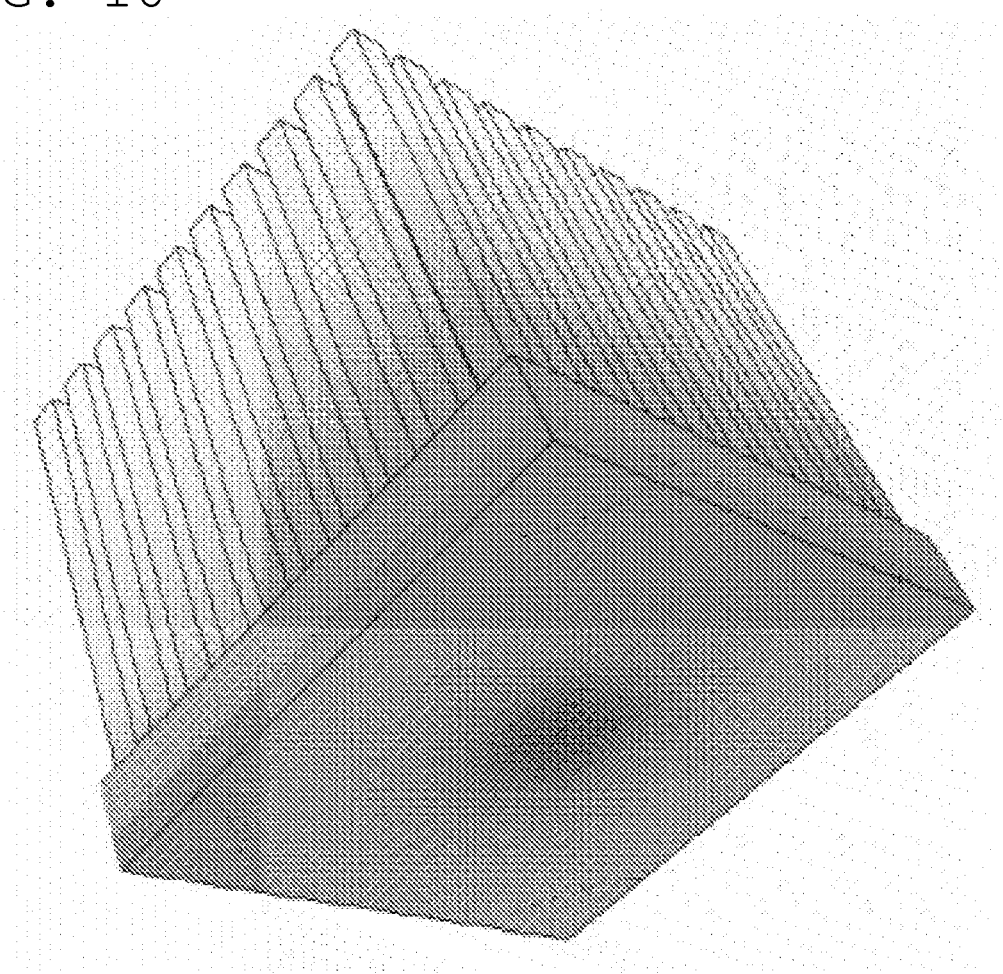
FIG. 16 illustrates an oblique view of the heat sink of FIG. 12 that reflects the results of a simulation of the Present Application upon the surface temperature of the heat sink.
Figure 17:
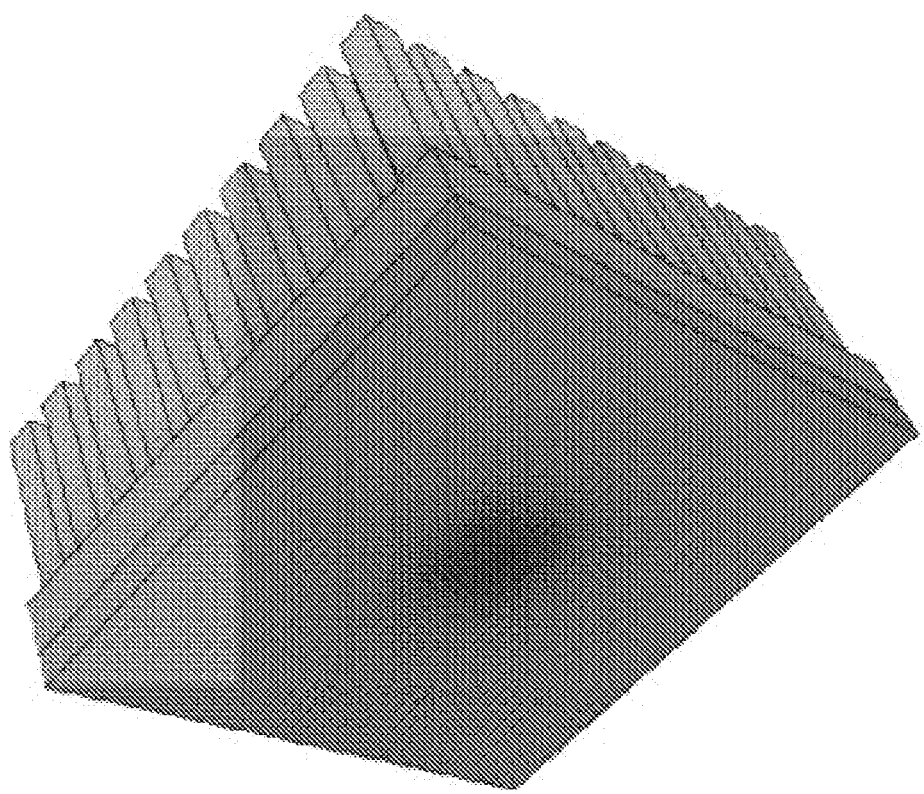
FIG. 17 illustrates an oblique view of the heat sink of FIG. 12 that reflects the results of a simulation of the Present Application upon the surface temperature of the heat sink.

In FIGS. 16-7, the darker-colored portions indicate higher temperatures, while the lighter-colored portions indicate lower temperatures. As is clear from FIG. 16, in the case of using the heat sink, the difference between the temperature of the central area and the temperature of the peripheral area is small. In particular, one can see that the temperature of the central area is not so much higher in comparison to the peripheral area. To wit, one can see that the heat sink conducts the heat from the heat-radiating body in a manner dispersed between the central area and the peripheral area. In contrast, as is clear from FIG. 17, the color of the central area is extremely dark with the heat sink, so heat is conducted mainly by the base. To wit, the heat is not dispersed by the heat sink, but rather heat is conducted from the heat-generating body directly in the direction of the thickness of the heat sink.

In this manner, from the simulation as well, the heat sink was confirmed to conduct heat while dispersing the heat from the heat-generating body in the interior of the heat sink. Note that in the simulation, the heat-generating body is envisioned to be placed at the center of the heat-receiving surface of the heat sink.

Figure 18:
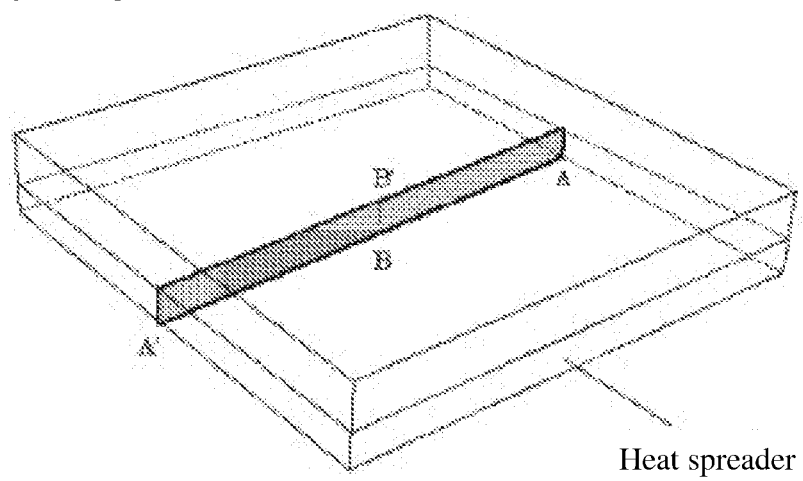
FIG. 18 illustrates a schematic diagram illustrating an experiment regarding the effect of reducing the temperature gradient in the heat sink of the Present Application.

Next, the effect of temperature smoothing within the flat plate-shaped heat pipe and heat sink was compared with the effect of decreasing the temperature gradient in the thickness direction. FIG. 18 illustrates the experiment setup, and FIG. 19 illustrates the temperature distribution along the horizontal cross section A-A' and the vertical cross section B-B' within the flat plate-shaped heat pipe as shown in FIG. 18 using a three-dimensional curve. Also, the magnitude of the slope at B-B' shown in FIG. 19(a) illustrates the temperature gradient at B-B' in FIG. 18. In other words, it illustrates the temperature gradient in the flat plate-shaped heat pipe in contact with the heat sink corresponding to the gist of the Present Application. The slope at B-B' shown in FIG. 19(b) illustrates the temperature gradient in the flat plate-shaped heat pipe in contact with the heat sink.

As can be seen in FIGS. 19(a) and 19(b), the temperature gradient was smaller in the case of using the heat sink. If the temperature gradient is small, this can lessen the increase in temperature of the heat-generating body compared to room temperature. On the other hand, as can be seen from FIG. 19(b), the temperature gradient is large in the case of using the heat sink according. Note that what is shown in FIG. 19 is the temperature gradient of the flat plate-shaped heat pipe portion of the heat sink, but the flat plate-shaped heat pipe is one part of the heat sink so one can take this to indicate the temperature gradient in the heat sink (or the base portion of the heat sink). In this manner, from the experimental results as well, one can see that a heat sink that has the thermal resistance of the facing portion higher than the thermal resistance of the surrounding portion, which is the gist of the Present Application, has a small temperature gradient, so the increase in the temperature of the heat-radiating body compared to room temperature can be suppressed.

Another experiment was conducted upon the effect of reducing the temperature by means of cooling modules that combined the heat sink with: (1) a flat plate-shaped heat pipe, (2) a copper plate (copper heat-diffusing member), and (3) an aluminum plate (an aluminum heat-diffusing member). Note that the flat plate-shaped heat pipe given by (1) is, as described above, a member that achieves the cooling effect by the vaporization and condensation of coolant sealed inside, while the copper plate in (2) and the aluminum plate in (3) are simple metal plates. For each of the combined cooling modules indicated by (1)-(3), we compared the maximum temperatures and minimum temperatures in the interior of the cooling module, and calculated the temperature-reducing effect. The results of calculations are shown in the following Table:

|  | Flat plate-shaped heat pipe + heat sink | | | Copper plate + heat sink | | | Aluminum plate + heat sink | | |
|---|---|---|---|---|---|---|---|---|---|
|  | $T_{min}$ | $T_{max}$ | Temperature-reducing effect | $T_{min}$ | $T_{max}$ | Temperature-reducing effect | $T_{min}$ | $T_{max}$ | Temperature-reducing effect |
| Comparative Example 1 | 316.8 | 332.6 |  | 315.9 | 342.7 |  | 315.3 | 356.7 |  |
| Working Example 1 | 305.8 | 325.6 | 2.10% | 305.4 | 339.4 | 0.96% | 305.2 | 353.8 | 0.81% |

As is clear from the above Table, the temperature-reducing effect of the cooling module combined with the flat plate-shaped heat pipe was greatest. Because of this, it can be seen that the cooling effect when combined with a flat plate-shaped heat pipe is high. From the experimental results illustrated in FIG. 19, it can be seen that the cooling effect of the heat sink according to the Present Application is high, and from the results shown in the Table, it can be seen that the cooling effect of the cooling module according to the Present Application which combines a heat sink and a flat plate-shaped heat pipe is also high.

From the above experimental results, the heat sink according to the Present Application can suppress the increase in the temperature of the heat-generating body. In addition, by combining it with a flat plate-shaped heat pipe which utilizes the vaporization and condensation of a coolant, the increase in the temperature of the heat-generating body can be suppressed with an even higher efficiency.

As described above, with the heat sinks and cooling modules according to the Present Application, heat from the heat-generating body moves readily in the planar direction, so the movement of heat in the interior of the base is distributed, resulting in parallel movement. As a result, the heat flux $q_x$ is reduced and the temperature gradient in the base and fins are reduced. By reducing the temperature gradient, the increase in temperature of the heat-generating body compared to room temperature is suppressed.

Note that the heat sinks and cooling modules are thought to be often placed near the center of the base, so it is preferable to manufacture the heat sinks and cooling modules according to the Present Application with the facing portion near the center of the base. Naturally, depending on the circumstances of use, it is also conceivable that the heat sink faces the heat-generating body at the edge of the base, and in this case, it is sufficient to manufacture the heat sink with the facing portion at the edge of the base. These heat sinks, cooling modules and coolable electronic boards are applicable to a wide range of fields including electronic equipment, manufacturing machinery, industrial machinery, automobiles, aeronautical equipment and the like. The Present Application is preferably utilized in fields wherein electronic components, electronic devices and other heat-generating bodies are cooled.

While a preferred embodiment of the Present Application is shown and described, it is envisioned that those skilled in the art may devise various modifications without departing from the spirit and scope of the foregoing Description and the appended Claims.

What is claimed is:

1. A heat sink, the heat sink comprising:
a base, the base facing a heat-generating body and absorbing heat therefrom, the base including a facing portion and a surrounding portion, the facing portion being in contact with the heat-generating body, and the surrounding portion being in contact with the facing portion on at least two sides thereof, the base further including a heat-receiving surface and a heat-radiating surface, the heat-radiating surface including a plurality of fins;
wherein the thermal resistance of the facing portion is higher than the thermal resistance of the surrounding portion, and the thermal resistance of the fins, provided upon a first region of the heat-radiating surface corresponding to the facing portion, is higher than the thermal resistance of the fins, provided upon a second region of the heat-radiating surface corresponding to the surrounding portion, such that the temperature increase of the heat-generating body, compared to ambient temperature, is suppressed.

2. The heat sink according to claim 1, wherein the facing portion is made of a material with a higher thermal resistance than that of the surrounding portion.

3. The heat sink according to claim 1, wherein the heat-receiving surface faces the heat-generating body and the heat-radiating surface is disposed opposite the heat-receiving surface.

4. The heat sink according to claim 1, wherein the number of fins per unit of surface area provided in the first region is fewer than the number of fins per unit of surface area provided in the second region.

5. The heat sink according to claim 1, wherein the total volume of the fins provided in the first region is smaller than the total volume of the fins provided in the second region.

6. A cooling module, the cooling module comprising:
   a flat plate-shaped base, the base including a heat-receiving surface and a heat-radiating surface, the heat-receiving surface including a facing portion and a surrounding portion, the heat-radiating surface including a plurality of fins; and
   a flat plate-shaped heat pipe facing the heat-receiving surface, the heat pipe being in contact with the facing portion;
   wherein:
      in the base, the thermal resistance of the facing portion which faces the flat plate-shaped heat pipe is higher than the thermal resistance of the surrounding portion which surrounds the facing portion on at least two sides thereof;
      the thermal resistance of the fins, provided upon a first region of the heat-radiating surface corresponding to the facing portion, is higher than the thermal resistance of the fins, provided upon a second region of the heat-radiating surface corresponding to the surrounding portion; and
   the flat plate-shaped heat pipe suppresses the temperature increase of a heat-generating body, compared to ambient temperature, by means of the evaporation and condensation of a coolant sealed inside.

7. A coolable electronic board, the coolable electronic board comprising:
   an electronic board;
   an electronic component, the electronic component being capable of generating heat and mounted upon the electronic board; and
   a cooling module which is disposed facing the electronic component, the cooling module including a facing portion, a surrounding portion, a heat-receiving surface and a heat-radiating surface, the facing portion being in contact with the electronic component, and the surrounding portion being in contact with the facing portion on at least two sides thereof, the heat-radiating surface including a plurality of fins;
   wherein the thermal resistance of the fins, provided upon a first region of the heat-radiating surface corresponding to the facing portion, is higher than the thermal resistance of the fins provided upon a second region of the heat-radiating surface corresponding to the surrounding portion, such that the temperature increase of the electronic component, compared to ambient temperature, is suppressed.

* * * * *